United States Patent
Mori et al.

(10) Patent No.: US 11,427,888 B2
(45) Date of Patent: Aug. 30, 2022

(54) SPUTTERING TARGET MATERIAL

(71) Applicant: MITSUBISHI MATERIALS CORPORATION, Tokyo (JP)

(72) Inventors: Satoru Mori, Saitama (JP); Satoshi Kumagai, Osaka (JP); U Tani, Osaka (JP); Yuuji Sato, Waki (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 28 days.

(21) Appl. No.: 17/040,654

(22) PCT Filed: Oct. 23, 2019

(86) PCT No.: PCT/JP2019/041525
§ 371 (c)(1),
(2) Date: Sep. 23, 2020

(87) PCT Pub. No.: WO2020/144913
PCT Pub. Date: Jul. 16, 2020

(65) Prior Publication Data
US 2021/0010105 A1 Jan. 14, 2021

(30) Foreign Application Priority Data
Jan. 7, 2019 (JP) .............................. JP2019-000733

(51) Int. Cl.
*C23C 14/14* (2006.01)
*C22C 9/00* (2006.01)
*B22D 7/00* (2006.01)
*B22F 3/16* (2006.01)
*C23C 14/34* (2006.01)
*H01L 21/285* (2006.01)

(52) U.S. Cl.
CPC ................ *C22C 9/00* (2013.01); *B22D 7/005* (2013.01); *B22F 3/162* (2013.01); *C23C 14/14* (2013.01); *C23C 14/3407* (2013.01); *B22F 2301/10* (2013.01); *H01L 21/2855* (2013.01)

(58) Field of Classification Search
CPC ..... C23C 14/14; C23C 14/34; C23C 14/2407; C23C 14/3414; C23C 9/00; C23C 9/02; C23C 9/06; C23C 9/08; B22F 2301/10; B22F 3/162; B22D 7/005; C22F 1/00; C22F 1/08; H01L 21/285; H01L 21/2855

USPC .......................................... 204/298.12, 298.13
See application file for complete search history.

(56) References Cited

U.S. PATENT DOCUMENTS

| | | | |
|---|---|---|---|
| 6,451,135 | B1 | 9/2002 | Takahashi et al. |
| 2012/0328468 | A1 | 12/2012 | Kumagai et al. |

FOREIGN PATENT DOCUMENTS

| | | |
|---|---|---|
| JP | 2000-045065 A | 2/2000 |
| JP | 2001-342560 A | 12/2001 |
| JP | 3403918 B2 | 5/2003 |
| JP | 2011-184711 A | 9/2011 |
| JP | 2014-051709 A | 3/2014 |
| JP | 2014-201814 A | 10/2014 |
| JP | 2017-043790 A | 3/2017 |
| JP | 2017-071832 A | 4/2017 |
| JP | 2017-071833 A | 4/2017 |
| JP | 2017-071834 A | 4/2017 |
| JP | 2017-150008 A | 8/2017 |
| JP | 2017-150010 A | 8/2017 |
| JP | 2018-204103 A | 12/2018 |

OTHER PUBLICATIONS

International Search Report dated Nov. 26, 2019, issued for PCT/JP2019/041525 and English translation thereof.
Notice of Allowance dated Jun. 6, 2022, issued for Chinese Patent Application No. 201980018145.5 and English translation thereof.

*Primary Examiner* — Rodney G McDonald
(74) *Attorney, Agent, or Firm* — Locke Lord LLP

(57) ABSTRACT

A sputtering target material contains one kind or two or more kinds selected from the group consisting of Ag, As, Pb, Sb, Bi, Cd, Sn, Ni, and Fe in a range of 5 massppm or more and 50 massppm or less, in terms of a total content; and a balance consisting of Cu and an inevitable impurity. In the sputtering target material, in a case in which an average crystal grain size calculated as an area average without twins is denoted by X1 (µm), and a maximum intensity of pole figure is denoted by X2, upon an observation with an electron backscatter diffraction method, Expression (1): $2500 > 19 \times X1 + 290 \times X2$ is satisfied, a kernel average misorientation (KAM) of a crystal orientation measured by an electron backscatter diffraction method is 2.0° or less, and a relative density is 95% or more.

20 Claims, No Drawings

SPUTTERING TARGET MATERIAL

TECHNICAL FIELD

The present invention relates to a sputtering target material which is used in a case of forming a copper film that is used as a wiring film and the like in a semiconductor device, a flat panel display such as a liquid crystal or an Organic Light-Emitting Diode (OLED) panel, a touch panel or the like.

Priority is claimed on Japanese Patent Application No. 2019-000733, filed Jan. 7, 2019, the content of which is incorporated herein by reference.

BACKGROUND ART

Conventionally, Al has been widely used as a material of a wiring film for semiconductor devices, flat panel displays such as liquid crystal and organic EL panels, touch panels, or the like. Recently, efforts have been made to miniaturize (narrow) and thin the wiring film, and a wiring film having a lower specific resistivity than the related art has been demanded.

Therefore, a wiring film formed of copper (Cu) that is a material having a lower specific resistivity than Al is provided with the miniaturization and thinning of the wiring film described above.

The above described wiring film is usually deposited in a vacuum atmosphere using a sputtering target. In a case in which deposition is performed using a sputtering target, an abnormal discharge (arcing) may occur due to foreign matter in the sputtering target, and thus a uniform wiring film may not be formed. The abnormal discharge is a phenomenon in which an excessively higher current than a current during normal sputtering suddenly and drastically flows, and an abnormally high discharge rapidly occurs. Due to the occurrence of such an abnormal discharge, there is concern that particles may be generated or the film thickness of the wiring film may be uneven. Therefore, it is desirable to avoid the abnormal discharge during deposition as much as possible.

Techniques for suppressing the occurrence of abnormal discharge during deposition in a pure copper-based sputtering target are proposed in the following Patent Literatures 1 to 7.

It is proposed in Patent Literature 1 that a hot-rolled copper sheet consists of pure copper having a purity of 99.99 mass % or higher and has an average crystal grain size of 40 µm or less, in which a ratio of a ($\Sigma 3+\Sigma 9$) grain boundary length is specified.

It is proposed in Patent Literature 2 that a high-purity copper sputtering target material has a purity of Cu excluding O, H, N, and C is 99.99998 mass % or higher, in which the upper limits of contents of Al, Si, Fe, S, Cl, O, H, N, and C are specified, and a ratio of large tilt angle grain boundary length is specified.

It is proposed in Patent Literature 3 that a high-purity copper sputtering target material has a purity of Cu excluding O, H, N, and C is 99.99998 mass % or higher, in which the upper limits of contents of Al, Si, Fe, S, Cl, O, H, N, and C are specified, and a kernel average misorientation of a crystal orientation, which is obtained by a crystal orientation measurement with an electron backscatter diffraction, is specified.

It is proposed in Patent Literature 4 that a high-purity copper sputtering target material has a purity of Cu excluding O, H, N, and C is 99.99998 mass % or higher, in which the upper limits of contents of Al, Si, Fe, S, Cl, O, H, N, and C are specified, and the number of molecules of released gas that is released by a temperature-programmed desorption gas analyzer is specified.

It is proposed in Patent Literature 5 that a high-purity copper sputtering target material has a purity of Cu excluding O, H, N, and C is 99.99998 mass % or higher, in which the upper limits of contents of Al, Si, Fe, S, Cl, O, H, N, and C are specified, and an average value (GOS) of crystal misorientations between one measurement point and all of other measurement points in an identical crystal grain, the average value being obtained by a crystal orientation measurement with an electron backscatter diffraction, is specified.

It is proposed in Patent Literature 6 that a high-purity copper sputtering target material has a purity of Cu excluding O, H, N, and C is 99.99998 mass % or higher, in which the upper limits of contents of Al, Si, Fe, S, Cl, O, H, N, and C are specified, and an area ratio of crystals having a plane orientation of <113>±10° on a sputtering surface of the target, the area ratio being obtained by a crystal orientation measurement with an electron backscatter diffraction, is specified.

It is proposed in Patent Literature 7 that a high-purity copper sputtering target material has a purity of Cu excluding O, H, N, and C is 99.99998 mass % or higher, in which the upper limits of contents of Al, Si, Fe, S, Cl, O, H, N, and C are specified, and the number of $H_2O$ gas molecules of gas components released by a temperature-programmed desorption gas analyzer is specified.

CITATION LIST

Patent Literature

[Patent Literature 1]
  Japanese Unexamined Patent Application, First Publication No. 2014-201814
[Patent Literature 2]
  Japanese Unexamined Patent Application, First Publication No. 2017-043790
[Patent Literature 3]
  Japanese Unexamined Patent Application, First Publication No. 2017-071832
[Patent Literature 4]
  Japanese Unexamined Patent Application, First Publication No. 2017-071833
[Patent Literature 5]
  Japanese Unexamined Patent Application, First Publication No. 2017-071834
[Patent Literature 6]
  Japanese Unexamined Patent Application, First Publication No. 2017-150008
[Patent Literature 7]
  Japanese Unexamined Patent Application, First Publication No. 2017-150010

SUMMARY OF INVENTION

Technical Problem

Recently, in semiconductor devices, flat panel displays such as liquid crystal and organic EL panels, touch panels, or the like, a higher density of a wiring film is demanded, and it is necessary to stably form a miniaturized and thinned wiring film more than ever before. In addition, it is necessary to apply a high voltage for further high speed deposition, and in this case as well, it is required to suppress the occurrence of abnormal discharge.

Here, the inventions described in Patent Literatures 1 to 7 each are recognized to have a sufficient effect of suppressing the abnormal discharge.

However, in the inventions described in Patent Literatures 1 to 7, since the inventions are formed of high-purity copper, crystal grains grow to be easily coarsened in a case of long-term use, due to thermal history during sputtering, and a crystal orientation tends to concentrate on a preferred orientation. Therefore, there are concerns that the occurrence of abnormal discharge (arcing) is not sufficiently suppressed during deposition, and a miniaturized and thinned wiring film cannot be efficiently and stably formed.

The present invention has been made in view of the above described circumstances, and an object thereof is to provide a sputtering target material that can sufficiently suppress the occurrence of abnormal discharge (arcing) during deposition and that can be used for forming a miniaturized and thinned copper film efficiently and stably, even in a case of long-term use.

Solution to Problem

In order to solve the above described problems, a sputtering target material of the present invention contains one kind or two or more kinds selected from the group consisting of Ag, As, Pb, Sb, Bi, Cd, Sn, Ni, and Fe in a range of 5 massppm or more and 50 massppm or less, in terms of a total content; and a balance consisting of Cu and an inevitable impurity, in which in a case in which an average crystal grain size calculated as an area average without twins is denoted by X1 (μm), and a maximum intensity of pole figure is denoted by X2, upon an observation with an electron backscatter diffraction method, $$2500 > 19 \times X1 + 290 \times X2 \qquad \text{Expression (1):}$$

is satisfied, a kernel average misorientation (KAM) of a crystal orientation measured by an electron backscatter diffraction method is 2.0° or less, and a relative density is 95% or more.

In the sputtering target material having this configuration, since Expression (1): $2500 > 19 \times X1 + 290 \times X2$ is satisfied in the case in which an average crystal grain size calculated as an area average without twins is denoted by X1 (μm), and a maximum intensity of pole figure is denoted by X2, upon an observation with an electron backscatter diffraction method, the average crystal grain size is sufficiently small, and the crystal orientation is random. Therefore, it is possible to sufficiently suppress the occurrence of abnormal discharge during sputter deposition.

In addition, since the sputtering target material contains the one kind or two or more kinds selected from the group consisting of Ag, As, Pb, Sb, Bi, Cd, Sn, Ni, and Fe in the range of 5 massppm or more and 50 massppm or less, in terms of a total content, and the balance with a composition consisting of Cu and an inevitable impurity, it is possible to suppress growth of the crystal grain and suppress crystal from concentrating on a preferred orientation even in a case of applying heat, due to the elements of Ag, As, Pb, Sb, Bi, Cd, Sn, Ni, and Fe. Therefore, even in a case of long-term use, it is possible to sufficiently suppress the occurrence of abnormal discharge (arcing) during sputter deposition. In addition, since the total content of the above described elements is limited to 50 massppm or less, it is possible to suppress specific resistivity of the deposited copper film from being significantly reduced. Thus the sputtering target material can be appropriately used as a wiring film, and the like. Furthermore, a region where a concentration of locally added elements is high (a region having a high concentration of additional elements) is hardly generated on a target sputtering surface, and it is possible to suppress the occurrence of abnormal discharge due to this region having a high concentration of additional elements.

In addition, the kernel average misorientation (KAM) of the crystal orientation measured by the electron backscatter diffraction method is 2.0° or less, so that strain in the crystal grain is small, and a situation in which secondary electrons are generated during sputtering is stabilized. Therefore, it is possible to suppress the occurrence of abnormal discharge.

Furthermore, since the relative density is 95% or more, few voids exist therein, and it is possible to suppress the occurrence of abnormal discharge due to the voids.

Here, in the sputtering target material of the present invention, it is preferable that an average value (GOS (Grain Orientation Spread)) of crystal misorientations between one measurement point and all of other measurement points in an identical crystal grain, which are measured by the electron backscatter diffraction method, is 4° or less.

In this case, since the average value (GOS) of the kernel average misorientation of the crystal orientation between one measurement point and all of other measurement points in the identical crystal grain is 4° or less, the kernel average misorientation in the crystal grain is small, and the situation in which secondary electrons are generated during sputtering is stabilized. Therefore, it is possible to suppress the occurrence of abnormal discharge.

In addition, the sputtering target material of the present invention may contain one kind or two or more kinds selected from the group consisting of Ag, As, Pb, Sb, Bi, Cd, Sn, Ni, and Fe in a range of 10 massppm or more and 50 massppm or less, in terms of a total content.

In this case, since the sputtering target material contains the one kind or two or more kinds selected from the group consisting of Ag, As, Pb, Sb, Bi, Cd, Sn, Ni, and Fe in the total content of 10 massppm or more, it is possible to reliably suppress the growth of the crystal grain and further efficiently suppress the crystal from concentrating on a preferred orientation even in a case of applying heat, due to the elements of Ag, As, Pb, Sb, Bi, Cd, Sn, Ni, and Fe.

Furthermore, in the sputtering target material of the present invention, in the case in which an average crystal grain size calculated as an area average without twins is denoted by X1 (μm), and a maximum intensity of pole figure is denoted by X2, in the observation with the electron backscatter diffraction method, $$1600 > 11 \times X1 + 280 \times X2 \qquad \text{Expression (2):}$$

is preferably satisfied.

In this case, since Expression (2): $1600 > 11 \times X1 + 280 \times X2$ is satisfied in the case in which an average crystal grain size calculated as an area average without twins is denoted by X1 (μm), and a maximum intensity of pole figure is denoted by X2, in the observation with the electron backscatter diffraction method, the average crystal grain size is more small, and the crystal orientation is more random. Therefore, it is possible to more suppress the occurrence of abnormal discharge during sputter deposition.

In addition, in the sputtering target material of the present invention, the kernel average misorientation (KAM) of the crystal orientation measured by the electron backscatter diffraction method is set to 1.5° or less.

In this case, the strain in the crystal grain is more reduced, and a situation in which secondary electrons are generated during sputtering is stabilized. Therefore, it is possible to suppress the occurrence of abnormal discharge more efficiently.

Furthermore, the sputtering target material of the present invention may be formed of a sintered body of copper powder.

In this case, the average crystal grain size X1 of the sputtering target can be reduced by adjusting the grain size of the copper powder as a raw material. In addition, orientation properties of crystal tend to be random, and the maximum intensity X2 of pole figure is small. Therefore, it is possible to even more reliably suppress the occurrence of abnormal discharge during sputter deposition.

Advantageous Effects of Invention

According to the present invention, even in a case of long-term use, it is possible to provide a sputtering target material that can sufficiently suppress the occurrence of abnormal discharge (arcing) during deposition and that can be used for forming a miniaturized and thinned copper film efficiently and stably.

DESCRIPTION OF EMBODIMENTS

Hereinbelow, a sputtering target material according to an embodiment of the present invention will be described.

The sputtering target material of the present embodiment is used in a case in which a copper film that is used as a wiring film in a semiconductor device, a flat panel display such as a liquid crystal or an organic EL panel, a touch panel, or the like is deposited on a substrate.

In addition, the sputtering target material of the present embodiment contains one kind or two or more kinds selected from the group consisting of Ag, As, Pb, Sb, Bi, Cd, Sn, Ni, and Fe in a range of 5 massppm or more and 50 massppm or less, in terms of a total content, and a balance with a composition consisting of Cu and an inevitable impurity.

Furthermore, in the sputtering target material of the present embodiment, in the case in which an average crystal grain size calculated as an area average without twins is denoted by X1 (μm), and a maximum intensity of pole figure is denoted by X2, upon an observation with an electron backscatter diffraction method, $$2500 > 19 \times X1 + 290 \times X2 \quad \text{Expression (1):}$$

is satisfied.

In addition, in the sputtering target material of the present embodiment, a kernel average misorientation (KAM) of a crystal orientation measured by an electron backscatter diffraction method is 2.0° or less.

In addition, in the sputtering target material of the present embodiment, a relative density is 95% or more.

Furthermore, in the sputtering target material of the present embodiment, it is preferable that an average value (GOS) of crystal misorientations between one measurement point and all of other measurement points in an identical crystal grain, which are measured by the electron backscatter diffraction method, is 4° or less.

Hereinbelow, in the sputtering target material of the present embodiment, as described above, the reason for specifying the composition, the relational expression between the average crystal grain size and the maximum intensity of pole figure, the kernel average misorientation (KAM) of the crystal orientation measured by the electron backscatter diffraction method, the average value (GOS) of crystal misorientations between one measurement point and all of other measurement points in the identical crystal grain, which are measured by the electron backscatter diffraction method, as described above will be described.

(One kind or two or more kinds selected from the group consisting of Ag, As, Pb, Sb, Bi, Cd, Sn, Ni, and Fe)

The above described elements such as Ag, As, Pb, Sb, Bi, Cd, Sn, Ni, and Fe have a function of inhibiting the growth of crystal grains in a case of being added in a small amount to pure copper. Therefore, it is possible to suppress the crystal grains from being coarsened and to suppress the crystal orientation from concentrating on a preferred growth orientation due to thermal history during sputtering. On the other hand, in a case in which the above described Ag, As, Pb, Sb, Bi, Cd, Sn, Ni, and Fe are excessively contained, a specific resistivity value of a deposited copper film increases. Thus, characteristics as a wiring film may be insufficient. Furthermore, a region where a concentration of additional elements is high (a region having a high concentration of additional elements) and a region where a concentration of additional elements is low (a region having a low concentration of additional elements) are generated on a target sputtering surface. Therefore, there is concern that charges are accumulated in the region having a high concentration of additional elements and an abnormal discharge is likely to occur.

From the above description, in the present embodiment, a total content of one kind or two or more kinds selected from the group consisting of Ag, As, Pb, Sb, Bi, Cd, Sn, Ni, and Fe is specified to fall within a range of 5 massppm or more and 50 massppm or less.

In order to reliably suppress the growth of crystal grains, a lower limit of the total content of one kind or two or more kinds selected from the group consisting of Ag, As, Pb, Sb, Bi, Cd, Sn, Ni, and Fe is preferably 10 massppm or more, even more preferably 15 massppm or more, and more preferably 20 massppm or more. On the other hand, in order to further suppress the increase in the specific resistivity value of the deposited copper film and further suppress the occurrence of abnormal discharge due to the region having a high concentration of additional elements, Ag, As, Pb, Sb, Bi, Cd, an upper limit of the total content of one kind or two or more kinds selected from the group consisting of Ag, As, Pb, Sb, Bi, Cd, Sn, Ni, and Fe is preferably 40 massppm or less, and even more preferably 35 massppm or less.

(Relational Expression Between Average Crystal Grain Size and Maximum Intensity of Pole Figure)

In order to suppress the abnormal discharge during sputtering, it is preferable that a crystal grain size is fine and a crystal orientation is random.

In the present embodiment, a sputtering test was performed using various sputtering target materials, and an average crystal grain size X1 (μm) and a maximum intensity X2 of pole figure indicating orientation properties of the crystal orientation were adopted as explanatory variables, the number of abnormal discharges was adopted as an objective variable, and a multiple regression calculation is performed.

As a result, it was confirmed that the number of abnormal discharges during sputtering can be sufficiently reduced by satisfying Expression (1): $2500 > 19 \times X1 + 290 \times X2$. The above described average crystal grain size X1 was observed by an electron backscatter diffraction method (EBSD method) and was calculated as an area average without twins.

Here, in order to further reduce the number of abnormal discharges, 19×X1+290×X2 is preferably less than 2200, and even more preferably less than 2000.

In addition, in the present embodiment, the average crystal grain size X1 (μm) and the maximum intensity X2 of the pole figure even more preferably satisfy $$1600 > 11 \times X1 + 280 \times X2. \qquad \text{Expression (2):}$$

(Kernel Average Misorientation of Crystal Orientation)

In a case in which the kernel average misorientation (KAM) of the crystal orientation measured by the electron backscatter diffraction method (EBSD method) is more than 2.0°, strain in the crystal grain is relatively large. Therefore, there is concern that in a region where this strain exists, a situation in which secondary electrons are generated during sputtering is destabilized.

Thus, in the present embodiment, the kernel average misorientation (KAM) of the crystal orientation measured by the electron backscatter diffraction method is 2.0° or less, whereby the strain in the crystal grain is small, and the situation in which secondary electrons are generated during sputtering can be stabilized.

In order to reliably stabilize the situation in which secondary electrons are generated during sputtering, the KAM is preferably 1.5° or less, even more preferably 1.0° or less, and more preferably 0.7° or less.

(Relative Density)

In a case in which a relative density of the sputtering target material is low, a large number of voids exist therein. Therefore, there is concern that an abnormal discharge due to the voids may occur during sputter deposition.

Thus, in the present embodiment, a relative density of the sputtering target material is set to 95% or more.

The relative density of the sputtering target material is preferably 97% or more, and even more preferably 98% or more.

(Average Value of Crystal Misorientations Between One Measurement Point and all of Other Measurement Points in Identical Crystal Grain)

In a case in which an average value (GOS) of crystal misorientations between one measurement point and all of other measurement points in an identical crystal grain, which are measured by an electron backscatter diffraction method (EBSD method), is more than 4°, strain is relatively large. Therefore, there is concern that in a region where this strain exists, a situation in which secondary electrons are generated during sputtering is destabilized.

Thus, in the present embodiment, the average value (GOS) of crystal misorientations between one measurement point and all of other measurement points in the identical crystal grain, which are measured by the electron backscatter diffraction method, is 4° or less, whereby the strain in the crystal grain is small, and the situation in which secondary electrons are generated during sputtering can be stabilized.

In order to reliably stabilize the situation in which secondary electrons are generated during sputtering, the above described GOS is preferably 3° or less.

Next, a method of manufacturing a sputtering target material according to the present embodiment will be described. The sputtering target according to the present embodiment can be manufactured by a melt casting method or a powder sintering method.

Hereinbelow, a method of manufacturing a sputtering target that is formed of an ingot processed material manufactured by the melt casting method, and a method of manufacturing a sputtering target that is formed of a sintered body manufactured by the powder sintering method each will be described.

(Melt Casting Method)

Electrolytic copper having a copper purity of 99.99 mass % or higher is prepared and is subjected to electrolytic refining. The electrolytic copper is used as an anode, a titanium plate is used as a cathode, and the anode and the cathode are immersed into an electrolytic solution to perform electrolysis. Here, as the electrolyte solution, an electrolyte solution which is prepared by diluting copper nitrate as a reagent with water and further contains a hydrochloric acid added thereto is used. As described above, by adding a hydrochloric acid to the copper nitrate electrolyte, the generation of nitrous acid gas can be suppressed, and thus it is possible to reduce the amount of impurities in electrodeposited copper (refer to Japanese Patent No. 3102177). This electrolytic refining is executed, and accordingly, high-purity copper in which the purity of Cu excluding O, H, N, and C is 99.99998 mass % or more is obtained.

Next, as a melting raw material, this high-purity copper is melted in a vacuum melting furnace, and elements such as Ag, As, Pb, Sb, Bi, Cd, Sn, Ni and Fe are added to the obtained molten copper, in terms of a total content, so as to be within the range of 5 massppm or more and 50 massppm or less. Then, a cast is performed to manufacture a copper ingot having the above composition.

Hot-forging is performed on the obtained copper ingot in a temperature range of 700° C. or higher and 900° C. or lower. Thereby, the cast structure collapses and is adjusted to a structure having equiaxial crystal grains.

Next, the above described hot-forging material is subjected to hot-rolling within the temperature range of 700° C. or higher and 900° C. or lower, whereby the crystal grain size is miniaturized. A processing rate per one pass during the hot-rolling is preferably within a range of 5% to 15%.

Next, the above described hot-rolling material is subjected to warm-working within a temperature range of 100° C. or higher and 200° C. or lower. A processing rate per one pass during the warm-working is preferably within a range of 5% to 10%.

Next, cold-rolling is performed on the above described warm worked material. In order to miniaturize the crystal grains, randomize the crystal orientation, and reduce the strain in the crystal grains, it is effective to increase a rolling reduction during the cold-rolling. Thereby, recrystallization is likely to be generated in subsequent heat treatment after cold-working, and the strain in the crystal grains is reduced. Therefore, the rolling reduction in one rolling pass is preferably within a range of 15% to 25%. Furthermore, a rolling ratio with respect to the entire rolling is preferably 40% or more.

Next, recrystallization heat treatment is performed on the cold-worked material. A temperature in the heat treatment is preferably within a range of 250° C. or higher and 350° C. or lower, and a holding time is preferably within a range of 2 hours or longer and 3 hours or shorter.

By repeating the cold-working and the heat treatment for a plurality of times, the crystal grains may be miniaturized, the crystal orientation may be randomized, and the strain in the crystal grains may be reduced.

Thereafter, a sputter target material having a predetermined dimension is obtained by machining. As described above, the sputtering target material formed of the ingot processed material is manufactured. In the sputtering target material formed of the ingot processed material manufactured by the melt casting method, few voids exist therein, and a relative density is 95% or more.

(Powder Sintering Method)

The high-purity copper having a copper purity of 99.9999 mass % or higher is melted, and elements such as Ag, As, Pb, Sb, Bi, Cd, Sn, Ni and Fe are added so as to be within the range of 5 massppm or more and 50 massppm or less, in terms of a total content. Then, casting is performed to obtain a copper ingot. This copper ingot is rolled into an anode plate. In addition, a rolled plate of high-purity copper having a copper purity of 99.9999 mass % or higher is used as a cathode plate.

The above described anode plate and cathode plate are immersed in a copper sulfate solution, and a direct current is passed under normal electrolysis conditions to obtain electrolytic copper powder. The obtained electrolytic powder is subjected to pickling and neutralization, dehydration, drying, and sieving to obtain electrolytic copper powder having a predetermined average grain size. Then, the obtained electrolytic copper powder is put together with a surfactant into a cylindrical container, and is mixed by spin for 48 hours. Thereby, raw material copper powder is obtained.

A graphite mold is filled with the obtained raw material copper powder, is set in a hot press machine, and is subjected to sintering to obtain a sintered body. Here, the sintering conditions are within the following range including: a load of 10 MPa or more and 20 MPa or less; a heating rate of 5° C./min or more and 20° C./min or less; a holding temperature of 850° C. or higher and 1050° C. or lower; a holding time of one hour or longer and two hours or shorter, in a vacuum atmosphere.

Here, the sintering conditions are set such that a relative density of the sintered body is 95% or more.

Thereafter, a sputter target material having a predetermined dimension is obtained by machining. As described above, the sputtering target material formed of the sintered body is manufactured.

As described above, the sputtering target material of the present embodiment is manufactured.

According to the sputtering target material of the present embodiment configured as described above, in the case in which an average crystal grain size calculated as an area average without twins is denoted by X1 (μm), and a maximum intensity of pole figure is denoted by X2, in the observation with the electron backscatter diffraction method (EBSD method), $$2500 > 19 \times X1 + 290 \times X2 \qquad \text{Expression (1):}$$

is satisfied. Therefore, the average crystal grain size is sufficiently small, and the crystal orientation is random, whereby it is possible to sufficiently suppress the occurrence of abnormal discharge during sputter deposition.

In addition, in a case in which the average crystal grain size X1 (μm) and the maximum intensity X2 of pole figure satisfy $$1600 > 11 \times X1 + 280 \times X2, \qquad \text{Expression (2):}$$

the average crystal grain size is further sufficiently small, and the crystal orientation is more random. Thereby, it is possible to further sufficiently suppress the occurrence of abnormal discharge during sputter deposition.

Furthermore, since the sputtering target material of the present embodiment contains one kind or two or more kinds selected from the group consisting of Ag, As, Pb, Sb, Bi, Cd, Sn, Ni, and Fe in a range of 5 massppm or more and 50 massppm or less, in terms of a total content, and a balance with a composition consisting of Cu and an inevitable impurity, it is possible to suppress growth of the crystal grain and suppress crystal from concentrating on a preferred orientation even in a case of applying heat, due to the elements of Ag, As, Pb, Sb, Bi, Cd, Sn, Ni, and Fe. Therefore, even in a case of long-term use, it is possible to sufficiently suppress the occurrence of abnormal discharge (arcing) during sputter deposition.

In addition, it is possible to suppress specific resistivity of the deposited copper film from being significantly reduced, and thus, the sputtering target material can be appropriately used as a wiring film, and the like.

In a case in which the sputtering target material contains one kind or two or more kinds selected from the group consisting of Ag, As, Pb, Sb, Bi, Cd, Sn, Ni, and Fe in a total content of 10 massppm or more, it is possible to further reliably suppress the growth of the crystal grain in the case of applying heat.

Furthermore, since in the sputtering target material of the present embodiment, the kernel average misorientation (KAM) of the crystal orientation measured by the electron backscatter diffraction method (EBSD method) is 2.0° or less, the strain in the crystal grain is small, and the situation in which secondary electrons are generated during sputtering is stabilized. Therefore, it is possible to suppress the occurrence of abnormal discharge.

In a case in which the kernel average misorientation (KAM) of the crystal orientation measured by the electron backscatter diffraction method (EBSD method) is 1.5° or less, the situation in which secondary electrons are generated during sputtering is further stabilized. Therefore, it is possible to reliably suppress the occurrence of abnormal discharge.

In addition, in the sputtering target material of the present embodiment, since the relative density is 95% or more, few voids exist in the sputtering target material, and it is possible to suppress the occurrence of abnormal discharge due to the voids during sputter deposition.

Furthermore, in the sputtering target material of the present embodiment, in a case in which the average value (GOS) of crystal misorientations between one measurement point and all of other measurement points in the identical crystal grain, which are measured by the electron backscatter diffraction method (EBSD method), is 4° or less, the kernel average misorientation in the crystal grain is small, and the situation in which secondary electrons are generated during sputtering is stabilized. Therefore, it is possible to suppress the occurrence of abnormal discharge.

In addition, in a case in which the sputtering target material of the present embodiment is formed of the sintered body of copper powder, the average crystal grain size X1 of the sputtering target material can be small by adjusting the grain size of the copper powder as a raw material, the orientation properties of crystal tend to be random, and the maximum intensity X2 in pole figure is small. Therefore, it is possible to even more reliably suppress the occurrence of abnormal discharge during sputter deposition.

As described above, the embodiment of the present invention is described, but the present invention is not limited thereto and can be appropriately modified without departing from the technical idea of the invention.

In the present embodiment, the sputtering target forming the copper film as the wiring film is described as an example, but the present invention is not limited thereto, and the sputtering target can be applied even in a case of using the copper film for other purposes.

In addition, the manufacturing method is not limited to the embodiment, and another manufacturing method may be used.

EXAMPLES

Hereinbelow, results of an evaluation test in which the above described sputtering target material of the above described embodiment has been evaluated are described.

Example 1

Electrolytic copper having a copper purity of 99.99 mass % or higher was prepared and subjected to electrolytic refining as described in the section of the embodiment to obtain a high-purity copper raw material in which the purity of Cu excluding O, H, N, and C is 99.99998 mass % or more.

This high-purity copper raw material was put into a crucible manufactured of high-purity carbon and was melted under vacuum at 1130° C. (pressure $10^{-3}$ Pa), and a predetermined amount of elements such as Ag, As, Pb, Sb, Bi, Cd, Sn, Ni, and Fe was added to the obtained molten copper.

Thereafter, casting into a mold manufactured of the high-purity carbon was performed in a vacuum state (pressure $10^{-3}$ Pa) to manufacture a copper ingot having a diameter of 80 mm and a height of 40 mm.

Here, in Examples 1 to 10 of the present invention and Comparative Examples 1 and 4, sputtering target materials were manufactured by the following steps.

In Comparative Example 2, a sputtering target material was manufactured without performing a heat treatment step described below.

In Comparative Example 3, a sputtering target material was manufactured without performing a hot-rolling step and a warm-rolling step.

1) Hot-forging step: Temperature 800° C.
2) Hot-rolling step: Temperature 800° C. and processing rate 10%
3) Warm-rolling step: Temperature 150° C. and processing rate 7%
4) Cold-rolling step: Processing rate 20%
5) Heat treatment step: Temperature 300° C. and holding time 2.5 hours
6) Machining step Through the above steps, a disk-shaped sputtering target material having a diameter of 125 mm and a thickness of 5 mm was obtained.

This sputtering target material was HIP-bonded to a backing plate of Cu—Cr—Zr alloy (C18150).

Regarding the obtained sputtering target material, a component composition, an average crystal grain size X1, a maximum intensity X2 of pole figure, kernel average misorientation (KAM) of a crystal orientation, an average value (GOS) of crystal misorientations between one measurement point and all of other measurement points in an identical crystal grain, and the number of abnormal discharge occurrences during sputter deposition were evaluated according to the following procedures. In addition, the sputtering target materials in Example 1 each have a relative density of 95% or more.

(Component Composition)

An analytical sample was taken from the obtained sputtering target material, crushed, pretreated with an acid, and then quantitatively analyzed for Ag, As, Pb, Sb, Bi, Cd, Sn, Ni, and Fe by an ICP (Inductively coupled plasma) method. Table 1 shows the evaluation results.

(Average Crystal Grain Size X1)

A measurement sample was taken from the sputtering target material, and IM4000 ion polishing was performed for 15 minutes. The ion-polished measurement sample was measured with an EBSD device (JSM-7001FA manufactured by JEOL Ltd.), and the average crystal grain size was obtained by area averaging without containing twins. Measurement conditions for EBSD are shown below.

Analysis range: 800.0 μm×1200.0 μm
Measurement step: 2.50 μm
Time required: 7.6 msec/point
SEM conditions are shown below.
Accelerating voltage: 15 kV
Beam current: about 3.2 nA
WD: 15 mm (Maximum Intensity X2 of Pole Figure)

Under the above described conditions, the maximum intensity X2 of pole figure was obtained using the EBSD device. Values of $19 \times X1 + 290 \times X2$ was calculated from the above described average crystal grain size X1 and the maximum intensity X2 of pole figure, and is shown in Table 2.

(Kernel Average Misorientation of Crystal Orientation)

The kernel average misorientation (KAM) of the crystal orientation was determined using the EBSD device under the above described conditions.

(Average Value of Crystal Misorientations Between One Measurement Point and all of Other Measurement Points in Identical Crystal Grain)

The average value (GOS) of crystal misorientations between one measurement point and all of other measurement points in the identical crystal grain was obtained using the EBSD device under the above described conditions.

(The Number of Abnormal Discharge Occurrences)

A sputtering test was conducted under conditions shown below, and the number of abnormal discharge occurrences during discharge for one minute was measured using an abnormal discharge measurement device (MAM Genesis manufactured by Landmark Technology Corp., threshold 500 V). As pre-sputtering, a sputtering power was increased to 200 W, 400 W, 1000 W, 2000 W, and 3000 W in this order and continuously discharged for 5 minutes respectively, and a total amount of power was set to 550 Wh. Then, the number of abnormal discharges generated during the amount of power of 15 kWh was measured. The evaluation results are shown in Table 2.

Sputtering method: DC magnetron sputter
Ultimate vacuum: $4 \times 10^{-6}$ Torr or less
Sputter Ar gas pressure: 0.4 Pa
Sputter power: 3000 W
Discharge method: Intermittent discharge every one minute
Measurement time: 10 hours after pre-sputtering

TABLE 1

| | | Target composition (massppm) | | | | | | | | | |
|---|---|---|---|---|---|---|---|---|---|---|---|
| | | Ag | As | Pb | Sb | Bi | Cd | Sn | Ni | Fe | Total amount | Cu and inevitable impurity |
| Examples of the present invention | 1 | 8.2 | 0.1 | 1.7 | <0.1 | 0.1 | <0.1 | 0.2 | 1.1 | 3.2 | 14.6 | Balanced |
| | 2 | 7.9 | 0.1 | 1.0 | <0.1 | 0.1 | <0.1 | 0.1 | 0.5 | 0.9 | 10.6 | Balanced |
| | 3 | 5.2 | 0.2 | 3.3 | 0.2 | 0.3 | 1.0 | 0.2 | 1.2 | 3.5 | 15.1 | Balanced |
| | 4 | 5.5 | 0.3 | 4.3 | 0.3 | 0.5 | 2.6 | 0.3 | 1.5 | 4.5 | 19.8 | Balanced |

TABLE 1-continued

| | | Target composition (massppm) | | | | | | | | | Total amount | Cu and inevitable impurity |
|---|---|---|---|---|---|---|---|---|---|---|---|---|
| | | Ag | As | Pb | Sb | Bi | Cd | Sn | Ni | Fe | | |
| | 5 | 6.5 | 0.4 | 3.5 | 1.0 | 0.2 | 1.8 | 0.2 | 1.4 | 3.2 | 18.2 | Balanced |
| | 6 | 7.0 | 0.2 | 4.6 | 1.5 | 0.5 | 1.2 | 1.2 | 1.3 | 4.1 | 21.6 | Balanced |
| | 7 | 8.9 | 0.2 | 5.5 | 0.4 | 0.9 | 1.0 | 1.3 | 5.6 | 10.5 | 34.3 | Balanced |
| | 8 | 9.0 | 0.1 | 6.7 | 0.3 | 0.7 | 0.5 | 3.5 | 7.9 | 20.5 | 49.2 | Balanced |
| | 9 | 8.5 | 0.2 | 9.0 | <0.1 | 0.5 | 0.5 | 1.5 | 8.9 | 20.6 | 49.7 | Balanced |
| | 10 | 8.1 | 0.1 | 1.0 | <0.1 | 0.1 | <0.1 | 0.3 | 1.5 | 3.0 | 14.1 | Balanced |
| Comparative Examples | 1 | 0.5 | 0.1 | 0.5 | <0.1 | 0.1 | <0.1 | 0.2 | 0.5 | 0.5 | 2.4 | Balanced |
| | 2 | 8.0 | 0.2 | 0.5 | 0.4 | 0.1 | <0.1 | 0.2 | 0.6 | 4.1 | 14.1 | Balanced |
| | 3 | 8.8 | 0.5 | 0.9 | 0.2 | 0.2 | 0.2 | 0.2 | 1.1 | 3.0 | 15.1 | Balanced |
| | 4 | 8.6 | 0.1 | 1.2 | 0.3 | 0.1 | 0.2 | 0.2 | 25.0 | 30.0 | 65.7 | Balanced |

TABLE 2

| | | Average crystal grain size X1 (μm) | Maximum intensity of pole figure | Expression (1)* | Expression (2)* | KAM (°) | GOS (°) | Number of abnormal discharge occurrences |
|---|---|---|---|---|---|---|---|---|
| Examples of the present invention | 1 | 74.3 | 3.71 | 2488 | 1856 | 1.30 | 1.11 | 2249 |
| | 2 | 86.0 | 2.58 | 2382 | 1668 | 0.70 | 0.53 | 2309 |
| | 3 | 89.3 | 2.05 | 2291 | 1556 | 1.30 | 0.91 | 1990 |
| | 4 | 87.5 | 2.85 | 2489 | 1761 | 0.80 | 0.66 | 1930 |
| | 5 | 80.9 | 2.19 | 2173 | 1503 | 1.01 | 1.10 | 2245 |
| | 6 | 78.9 | 2.40 | 2195 | 1540 | 1.20 | 1.05 | 1920 |
| | 7 | 89.0 | 2.35 | 2373 | 1637 | 0.92 | 1.02 | 2250 |
| | 8 | 90.5 | 2.33 | 2395 | 1648 | 0.98 | 1.20 | 2309 |
| | 9 | 83.6 | 3.05 | 2473 | 1774 | 1.40 | 3.60 | 2270 |
| | 10 | 75.0 | 3.50 | 2440 | 1805 | 1.48 | 5.10 | 2620 |
| Comparative Examples | 1 | 145.9 | 3.42 | 3764 | 2563 | 0.51 | 0.56 | 3350 |
| | 2 | 53.1 | 5.10 | 2488 | 2012 | 2.70 | 6.54 | 4340 |
| | 3 | 105.3 | 3.05 | 2885 | 2012 | 1.24 | 1.50 | 3058 |
| | 4 | 79.5 | 2.05 | 2105 | 1449 | 1.43 | 1.56 | 3320 |

*Expression (1): 19 × X1 + 290 × X2
*Expression (2): 11 × X1 + 280 × X2

The total content of one kind or two or more kinds selected from the group consisting of Ag, As, Pb, Sb, Bi, Cd, Sn, Ni, and Fe was 2.4 massppm, which is less than the range of the present invention. In addition, in Comparative Example 1 in which the relational expression between the average crystal grain size and the maximum intensity of pole figure was not satisfied, the number of abnormal discharge occurrences was large, and the stable sputter deposition was not performed. It is presumed that the crystal grains were not suppressed from being coarsened and the crystal orientation was not suppressed from concentrating on a preferred growth orientation due to thermal history during sputtering.

In Comparative Example 2 in which the heat treatment step was not performed, the KAM was large at 2.70° and GOS was large at 6.54°, the number of abnormal discharge occurrences was large, and the stable sputter deposition was not performed. It is presumed that there were a large number of strains in the crystal grain.

In Comparative Example 3 in which the hot-rolling step and the warm-rolling step were not performed and the relational expression between the average crystal grain size and the maximum intensity of pole figure was not satisfied, the number of abnormal discharge occurrences was large, and the stable sputter deposition was not performed. It is presumed that the crystal orientation was not suppressed from concentrating on a preferred growth orientation due to thermal history during sputtering.

In Comparative Example 4 in which the total content of one kind or two or more kinds selected from the group consisting of Ag, As, Pb, Sb, Bi, Cd, Sn, Ni, and Fe was 65.7 massppm, which is more than the range of the present invention, the number of abnormal discharge occurrences was large, and the stable sputter deposition was not performed. It is presumed that a region where a concentration of additional elements was high (a region having a high concentration of additional elements) and a region where a concentration of additional elements was low (a region having a low concentration of additional elements) were generated on a target sputtering surface, charges were accumulated in the region having a high concentration of additional elements, and the abnormal discharge occurred.

On the other hand, in Examples 1 to 10 of the present invention in which the total content of one kind or two or more kinds selected from the group consisting of Ag, As, Pb, Sb, Bi, Cd, Sn, Ni, and Fe was within the range of the present invention, and the average crystal grain size and the maximum intensity of pole figure satisfy Expression (1), the number of abnormal discharge occurrences was small, and the stable sputter deposition was performed.

Example 2

As described in the section of the embodiment, a rolled material obtained by adding a predetermined element as shown in Table 3 to high-purity copper having a copper purity of 99.9999 mass % or higher was used as an anode plate, and high-purity copper having a copper purity of 99.9999 mass % or higher was used as a cathode plate to obtain electrolytic copper powder. The obtained electrolytic powder was subjected to pickling and neutralization, dehydration, drying, and sieving to obtain electrolytic copper powder having an average grain size as shown in Table 4. Then, the obtained electrolytic copper powder is put together with a surfactant into a cylindrical container, and was mixed by spin for 48 hours. Thereby, raw material copper powder is obtained.

A graphite mold was filled with the obtained raw material copper powder, and was set in a hot press machine. Then, sintering was performed under the sintering conditions shown in Table 4 to obtain a sintered body.

A relative density of the obtained sintered body was measured. An actual density at room temperature was measured from dimensions and weight of the measurement sample, and a true density was set to 8.94 to calculate the relative density. The evaluation results are shown in Table 4.

Then, the obtained sintered body was subjected to machining to obtain a disk-shaped sputtering target material having a diameter of 125 mm and a thickness of 5 mm.

This sputtering target material was HIP-bonded to a backing plate of Cu—Cr—Zr alloy (C18150).

Regarding the obtained sputtering target material, a component composition, an average crystal grain size X1, a maximum intensity X2 of pole figure, kernel average misorientation (KAM) of a crystal orientation, an average value (GOS) of crystal misorientations between one measurement point and all of other measurement points in an identical crystal grain, and the number of abnormal discharge occurrences during sputter deposition were evaluated according to the same procedures as in Example 1. The evaluation results are shown in Table 5.

TABLE 3

|  |  | Target composition |  |  |  |  |  |  |  |  | Total amount | Cu and inevitable impurity |
|---|---|---|---|---|---|---|---|---|---|---|---|---|
|  |  | Ag | As | Pb | Sb | Bi | Cd | Si1 | Ni | Fe |  |  |
| Examples of the present invention | 11 | 7.0 | 0.2 | 0.6 | 0.1 | 0.1 | <0.1 | 0.1 | 0.1 | 0.2 | 8.4 | Balanced |
|  | 12 | 9.2 | 0.2 | 1.5 | <0.1 | 0.1 | <0.1 | 0.2 | 0.1 | 0.1 | 11.4 | Balanced |
|  | 13 | 5.1 | 0.1 | 0.1 | 0.1 | 0.1 | <0.1 | 0.1 | 0.1 | 0.1 | 5.8 | Balanced |
|  | 14 | 12.3 | 0.1 | 0.1 | 0.1 | 0.1 | 0.1 | 0.1 | 1.1 | 2.2 | 16.2 | Balanced |
| Comparative Example | 11 | 6.9 | 0.2 | 0.5 | 0.1 | 0.1 | <0.1 | 0.1 | 0.1 | 0.1 | 8.4 | Balanced |

TABLE 4

|  |  | Raw material copper powder | Sintering condition |  |  |  | Relative density of target (%) |
|---|---|---|---|---|---|---|---|
|  |  | Average grain size D50 (μm) | Load (MPa) | Heating rate (° C./min) | Holding temperature (° C.) | Holding time (hour) |  |
| Examples of the present invention | 11 | 3.0 | 15 | 10 | 1000 | 1 | 98.2 |
|  | 12 | 5.4 | 15 | 10 | 1000 | 1 | 97.5 |
|  | 13 | 2.5 | 10 | 5 | 900 | 2 | 97.8 |
|  | 14 | 8.9 | 20 | 20 | 1050 | 1 | 98.9 |
| Comparative Example | 11 | 3.0 | 10 | 10 | 800 | 1 | 93.5 |

TABLE 5

|  |  | Average crystal grain size X1 (μm) | Maximum intensity X2 of pole figure | Expression (1)* | Expression (2)* | KAM (°) | GOS (°) | Number of abnormal discharge occurrences (times/15 kWh) |
|---|---|---|---|---|---|---|---|---|
| Examples of the present invention | 11 | 26.2 | 1.50 | 933 | 708 | 1.45 | 1.21 | 759 |
|  | 12 | 29.9 | 1.50 | 1003 | 749 | 1.55 | 1.32 | 895 |
|  | 13 | 40.5 | 2.20 | 1408 | 1062 | 1.32 | 1.50 | 698 |
|  | 14 | 49.8 | 2.80 | 1758 | 1332 | 1.22 | 1.30 | 1100 |
| Comparative Example | 11 | 30.1 | 1.70 | 1065 | 807 | 1.50 | 1.60 | 3550 |

*Expression (1): $19 \times X1 + 290 \times X2$
*Expression (2): $11 \times X1 + 280 \times X2$ In Comparative Example 11 in which the relative density was 93.5%, the number of abnormal discharge occurrences was large. It is presumed that occurrence of the abnormal discharge was due to the voids existing inside the sintered body.

*Expression (1): 19×X1+290×X2
*Expression (2): 11×X1+280×X2

On the other hand, the relative density was 95% or more, and the total content of one kind or two or more kinds selected from the group consisting of Ag, As, Pb, Sb, Bi, Cd, Sn, Ni, and Fe was within the range of the present invention. Therefore, in Examples 11 to 14 of the present invention in which the average crystal grain size and the maximum intensity of pole figure satisfy Expression (1), the number of abnormal discharge occurrences was small, and the stable sputter deposition was performed.

As a result of the above described confirmatory experiment, according to Examples of the present invention, it was confirmed that the sputtering target material capable of sufficiently suppressing the occurrence of abnormal discharge (arcing) during deposition and capable of forming the miniaturized and thinned wiring film efficiently and stably, even in a case of long-term use, can be provided.

The invention claimed is:

1. A sputtering target material comprising:
   one kind or two or more kinds selected from the group consisting of Ag, As, Pb, Sb, Bi, Cd, Sn, Ni, and Fe in a range of 5 massppm or more and 50 massppm or less, in terms of a total content; and
   a balance consisting of Cu and an inevitable impurity,
   wherein in a case in which an average crystal grain size calculated as an area average without twins is denoted by X1 (in μm), and a maximum intensity of pole figure is denoted by X2 (in μm), upon an observation with an electron backscatter diffraction method,
   the sputtering target material satisfies the Expression (1): 2500>19×X1+290×X2,
   wherein the sputtering target material has a kernel average misorientation (KAM) of a crystal orientation measured by an electron backscatter diffraction method is 2.0° or less, and
   a relative density is 95% or more.

2. The sputtering target material according to claim 1, wherein the sputtering target material has an average value (grain orientation spread: GOS) of crystal misorientations between one measurement point and all of other measurement points in an identical crystal grain, which are measured by an electron backscatter diffraction method, is 4° or less.

3. The sputtering target material according to claim 1, wherein the sputtering target material contains one kind or two or more kinds selected from the group consisting of Ag, As, Pb, Sb, Bi, Cd, Sn, Ni, and Fe in a range of 10 massppm or more and 50 massppm or less, in terms of a total content.

4. The sputtering target material according to claim 1,
   wherein in the case in which an average crystal grain size calculated as an area average without twins is denoted by X1 (in μm), and a maximum intensity of pole figure is denoted by X2 (in μm), upon an observation with an electron backscatter diffraction method,
   the sputtering target material satisfies the Expression (2): 1600>11×X1+280×X2.

5. The sputtering target material according to claim 1, wherein the sputtering target material has a kernel average misorientation (KAM) of a crystal orientation measured by an electron backscatter diffraction method is 1.5° or less.

6. The sputtering target material according to claim 1, which wherein the sputtering target material is formed of a sintered body of copper powder.

7. The sputtering target material according to claim 2, wherein the sputtering target material contains one kind or two or more kinds selected from the group consisting of Ag, As, Pb, Sb, Bi, Cd, Sn, Ni, and Fe in a range of 10 massppm or more and 50 massppm or less, in terms of a total content.

8. The sputtering target material according to claim 2,
   wherein in the case in which an average crystal grain size calculated as an area average without twins is denoted by X1 (in μm), and a maximum intensity of pole figure is denoted by X2 (in μm), upon an observation with an electron backscatter diffraction method,
   the sputtering target material satisfies the Expression (2): 1600>11×X1+280×X2.

9. The sputtering target material according to claim 3,
   wherein in the case in which an average crystal grain size calculated as an area average without twins is denoted by X1 (in μm), and a maximum intensity of pole figure is denoted by X2 (in μm), upon an observation with an electron backscatter diffraction method,
   the sputtering target material satisfies the Expression (2): 1600>11×X1+280×X2.

10. The sputtering target material according to claim 7,
    wherein in the case in which an average crystal grain size calculated as an area average without twins is denoted by X1 (in μm), and a maximum intensity of pole figure is denoted by X2 (in μm), upon an observation with an electron backscatter diffraction method,
    the sputtering target material satisfies the Expression (2): 1600>11×X1+280×X2.

11. The sputtering target material according to claim 2, wherein the sputtering target material has a kernel average misorientation (KAM) of a crystal orientation measured by an electron backscatter diffraction method is 1.5° or less.

12. The sputtering target material according to claim 3, wherein the sputtering target material has a kernel average misorientation (KAM) of a crystal orientation measured by an electron backscatter diffraction method is 1.5° or less.

13. The sputtering target material according to claim 4, wherein the sputtering target material has a kernel average misorientation (KAM) of a crystal orientation measured by an electron backscatter diffraction method is 1.5° or less.

14. The sputtering target material according to claim 7, wherein the sputtering target material has a kernel average misorientation (KAM) of a crystal orientation measured by an electron backscatter diffraction method is 1.5° or less.

15. The sputtering target material according to claim 8, wherein the sputtering target material has a kernel average misorientation (KAM) of a crystal orientation measured by an electron backscatter diffraction method is 1.5° or less.

16. The sputtering target material according to claim 2, wherein the sputtering target material is formed of a sintered body of copper powder.

17. The sputtering target material according to claim 3, wherein the sputtering target material is formed of a sintered body of copper powder.

18. The sputtering target material according to claim 4, wherein the sputtering target material is formed of a sintered body of copper powder.

19. The sputtering target material according to claim 5, wherein the sputtering target material is formed of a sintered body of copper powder.

20. The sputtering target material according to claim 7, wherein the sputtering target material is formed of a sintered body of copper powder.

\* \* \* \* \*